United States Patent [19]
Leiphart

[11] Patent Number: 5,783,282
[45] Date of Patent: Jul. 21, 1998

[54] RESPUTTERING TO ACHIEVE BETTER STEP COVERAGE OF CONTACT HOLES

[75] Inventor: Shane P. Leiphart, Boise, Id.

[73] Assignee: Micron Technology, Inc., Boise, Id.

[21] Appl. No.: 726,657

[22] Filed: Oct. 7, 1996

[51] Int. Cl.$^6$ .............................. B32B 3/10; C23C 14/00
[52] U.S. Cl. .............. 428/138; 156/643.1; 156/644.1; 156/662.1; 204/192.11; 204/192.17; 204/192.32; 204/192.37
[58] Field of Search ................. 156/643.1, 644.1, 156/662.1; 204/192.11, 192.17, 192.32, 192.37; 428/138

[56] References Cited

U.S. PATENT DOCUMENTS

| | | | |
|---|---|---|---|
| 4,717,462 | 1/1988 | Homma et al. | 204/298 |
| 4,724,060 | 2/1988 | Sakata et al. | 204/298 |
| 4,824,544 | 4/1989 | Mikalesen et al. | 204/298 |
| 4,834,856 | 5/1989 | Wehner | 204/192.24 |
| 5,114,556 | 5/1992 | Lamont, Jr. | 204/192.12 |
| 5,302,266 | 4/1994 | Grabarz et al. | 204/192.12 |
| 5,482,611 | 1/1996 | Helmer et al. | 204/298.17 |
| 5,486,492 | 1/1996 | Yamamoto et al. | 437/192 |
| 5,658,438 | 8/1997 | Givens et al. | 204/192.11 |

OTHER PUBLICATIONS

Andy Clarke, "Low–Angle Sidewell Planarization", *Semiconductor International*, vol. 18, No. 9, 1, (Aug., 1995).
Shin–ichi Ogawa, et al., "Dependence of Thermal Stability of the Titanium Silicide/Silicon Structure on Impurities", *Applied Physics Letters*, vol. 56, No. 8, 725–727, (Feb. 19, 1990).
G. K. Wehner, "The Aspects of Sputtering in Surface Analysis Methods", *Methods of Surface Analysis*, Elsevier Scientific, vol. .1, 5–37, (1975).

*Primary Examiner*—Christopher Raimund
*Attorney, Agent, or Firm*—Schwegman, Lundberg, Woessner & Kluth, P.A.

[57] ABSTRACT

An improved apparatus and method for manufacturing semiconductor devices, and, in particular, for depositing material at the bottom of a contact hole, comprises sputtering a material onto a semiconductor substrate; applying a first bias voltage to the substrate, simultaneously removing the material surrounding the contact hole to form a facet at the top of the recess; and applying a second bias voltage to the substrate, simultaneously sputter-depositing the first material onto the bottom of the recess. A further embodiment of the invention utilizes an electrically isolated collimator for the sputtering apparatus. Another embodiment of the invention resputters a first material onto sidewalls of a contact hole during physical vapor deposition.

16 Claims, 5 Drawing Sheets

RESPUTTERING TO ACHIEVE BETTER STEP COVERAGE OF CONTACT HOLES

REFERENCE TO RELATED APPLICATIONS

Reference is made to a co-pending application entitled "Electrically Isolated Collimator and Method", Ser. No. 08/629,440, filed on Apr. 8, 1996, now U.S. Pat. No. 5,705,042 which is assigned to the same assignee as the present application.

TECHNICAL FIELD

This invention relates to methods and apparatus for manufacturing semiconductor devices, and, in particular, for improving step coverage in a recess within a semiconductor structure.

BACKGROUND

In the fabrication of semiconductor integrated circuits (ICs), active device regions are formed in semiconductor substrates, isolated from adjacent devices. Specific electrical paths connect such active devices, using high-conductivity, thin-film structures. Such structures make contacts with active devices through openings, or contact holes, in the isolating material. Of primary concern is the formation of low-resistivity contacts, in order to ensure devices perform properly. As ICs are scaled down in size, so are the devices which make up the ICs. Increases in resistance are associated with increasing circuit density and adversely affect device performance. Ways to decrease the overall resistance of ICs, including contacts, are crucial to continued successful device performance.

One way in which circuit resistance is decreased is by creating low-resistance, ohmic contacts at the device level. Ohmic contacts exhibit nearly linear current-voltage characteristics in both directions of current flow. Various factors affect the type of contact which is maintained. Increasing dopant concentration in the semiconductor contact area decreases contact resistance, up to the solubility of the dopant at the temperature at which it is introduced. Unclean semiconductor surfaces (ie., those which contain a native oxide film) increase contact resistance. It is difficult to keep high resistance native oxides from forming due to silicon's rapid oxidation rate when exposed to an oxygen ambient.

Conventionally, ohmic contacts to semiconductor substrates are formed by the following process steps: formation of heavily doped regions where contacts are to be made; etching a contact hole in the isolating oxide layer, which covers the semiconductor substrate; cleaning the semiconductor surface to remove native oxide; depositing a metal film over the wafer by physical vapor deposition (PVD); and annealing to improve the metal-to-semiconductor contact. During the metal deposition step, obtaining good bottom step coverage is very important in maintaining the overall ohmic contact. High-aspect ratio (ratio of height-to-opening of a contact hole) holes make it even more difficult to achieve good bottom step coverage. Such holes are much deeper than they are wide, preventing good bottom step coverage by conventional process steps.

While bottom step coverage may be increased by sloping the contact hole sidewalls along the depth of the contact hole, this severely decreases achievable device density because the top of the hole is larger than normal. The type of deposition also has an effect on the resulting step coverage. Chemical vapor deposition (CVD) processes are more likely to fill high-aspect ratio holes than physical vapor deposition (PVD) processes. However, some films cannot be deposited using CVD, due to contamination introduced by CVD processes. CVD is often accompanied by a significant amount of carbon, chlorine, oxygen, and other contaminants that are detrimental to device performance. Forming films that are free from contamination is even more important as devices decrease in size. Defects resulting from such contamination are even more dominant in thinner films, which are present in smaller devices.

Different types of metal layers are used to improve ohmic contacts. The most commonly used metals are reacted with underlying silicon to form silicides. Titanium silicide is the most commonly used metal silicide due to its superior qualities, one being its ability to getter oxygen. Titanium silicide forms good ohmic contacts with both polysilicon and single-crystal silicon doped contact areas. Silicides, in general, are preferred for contact formation due to their ability to reduce native oxide remaining on semiconductor substrates. This reduction occurs after a subsequent anneal step because titanium reacts with native oxide to form titanium oxide and titanium silicide, which is highly conductive. The oxide layer remains on top of the silicide layer after annealing, separated from the underlying silicon.

A primary method for depositing films by PVD is sputtering. Sputtering is a method by which atoms on a target are displaced to a desired surface, where they form a thin film. One of the major problems associated with obtaining good bottom step coverage utilizing PVD is material "overhang" at the "shoulder" (ie., the corner of a sidewall and the top surface) of contact openings. Material overhang, as shown at 114 and 116 of prior art FIG. 1, is formed of material deposited as layer 112 on an insulating material 122, which defines a contact hole 110 on a semiconductor substrate 124. This is a result of imperfect lines of incidence traveled by sputtered target atoms, because, in general, the ejection distribution profile of sputtered atoms is similar to a cosine profile. Thus, many sputtered atoms do not travel in a perpendicular plane, with respect to the source target surface. Doming, indicated at 126, of the sputtered material commonly occurs in the bottom of the contact hole 110 due to the imperfect lines of incidence. This results in poor bottom corner step coverage, as seen at 118 and 120, which often leads to contact failure.

Even with the use of collimated sputtering, techniques of collimating the sputtering beam are not perfect to enable precision in angles of incidence on the substrate. Many sputtered atoms do not land on the substrate at a perpendicular angle, as desired for prevention of material overhang. Thus, excess sputtered metal forms at the top of the opening, such that the geometry of the metallized opening does not generally match the geometry of the underlying opening in the substrate. Furthermore, prior art collimated sputtering apparatus are limited by the input power, or voltage, required to produce a dense plasma near the surface of the wafer. Prior art apparatus utilize a grounded collimator interposed between a target source and a substrate, which requires the use of a larger input power to produce a dense plasma at the wafer surface for depositing material within a contact hole.

Another problem is associated with the use of collimators and other traditional methods of obtaining adequate bottom step coverage. As bottom step coverage improves using traditional techniques, deposition on sidewalls of a contact hole decreases. High aspect ratio collimators essentially eliminate deposition on the sidewalls at the bottom of a contact hole. This creates a problem during subsequent process steps. The etch of a contact often trenches into the underlying substrate by hundreds of angstroms. Thus, if a barrier material is not present, subsequent metal deposition aggressively attacks the substrate, jeopardizing contact integrity. Typical barrier material comprises titanium nitride. Although titanium nitride can be deposited on sidewalls of a contact using CVD, this undesirably introduces contaminants into the titanium nitride film. Thus, there is a need for a new method for forming a barrier layer on the bottom of high aspect ratio contact sidewalls.

Thus, while a new method for forming a barrier layer is needed, it is essential that the method does not degrade the bottom step coverage of a contact hole. Maintaining adequate alloy bottom step coverage of contact holes is needed in order to decrease contact area resistance and prevent device failure. This problem is particularly acute in high-aspect ratio contact holes. There is a need for an improved method of obtaining better bottom step coverage of contact holes, without decreasing circuit density. As semiconductor chips are becoming more denselypopulated with devices, it is important to decrease device resistance without severely limiting the achievable circuit density on a chip. Furthermore, prior art collimated sputtering apparatus used for practicing this invention need to be made more efficient.

Methods of removing material overhang 114 and 116, as shown in FIG. 1, at the "shoulder" of contact openings 110 and redistributing it, without simultaneously removing metal at the bottom 126 of the contact opening 110, are necessary in order to provide better step coverage. Removing material at the bottom of contact holes 110 results in unwanted junction degradation if enough material is removed. There is a further need to adapt existing equipment to accomplish better step coverage, in order to save cost and time in fabricating such devices.

SUMMARY OF THE INVENTION

This invention relates to methods and apparatus for manufacturing semiconductor devices, and, in particular, for improving step coverage of recesses within semiconductor structures. The method comprises the steps of sputtering a first material onto a semiconductor substrate having of at least one recess, surrounded by a second material, to form a layer of deposited material. Resputtering of the layer of deposited material is performed at a first substrate bias, while simultaneously removing the surrounding second material to form a facet at the top of the recess. Sputter depositing is then done at a second substrate bias, which resputters sputtered material from the facet, preventing sputtered material from forming on the facet. By preventing material from forming on the facet during deposition at the second substrate bias, significant quantities of sputtered material are able to accumulate at the bottom of the contact hole, preventing doming. The contact hole formed by the method of this invention has improved step coverage over prior art techniques, due to removal of the material overhang. Circuit density is not compromised as in the prior art technique of sloping the contact hole sidewall along the entire depth of the contact hole.

A second embodiment of the invention comprises the steps of sputtering a first material onto a semiconductor substrate having at least one recess, surrounded by a second material, to form a layer of deposited material. Resputtering of the layer of deposited material is performed at a first substrate bias, while simultaneously removing the deposited material to form a facet at the top of the recess. Sputter depositing is then done at a second substrate bias, which resputters sputtered material from the deposited material facet, preventing sputtered material from forming on the facet. The resputtering step begins an appropriate period of time after initiating the sputtering step, to allow target material to form a layer of deposited material on the structure. The length of time varies depending on the materials utilized and other process parameters. This second embodiment also prevents material from forming on the facet during the second bias step, and significant quantities of sputtered material are able to accumulate at the bottom of the contact hole, without doming.

In a further embodiment of the invention, a wafer bias is applied during the second bias step, such that a portion of the deposited material on the contact bottom is resputtered onto contact sidewalls. In the preferred case, titanium is the deposited material. A subsequent anneal step in a nitrogen-containing ambient forms a passivating titanium nitride film on the sidewalls of the contact. This passivating film protects the underlying substrate from degradation when metal interconnect material is subsequently deposited in the contact hole. By resputtering a portion of the deposited titanium onto the sidewalls of the contact hole, chemical vapor deposition of titanium nitride is not required to form a titanium nitride film on the contact sidewalls.

A further embodiment of the invention utilizes an electrically isolated collimator for the sputtering step. Use of an electrically isolated collimator reduces the power, needed to provide a particular sputtering rate and bias voltage, as compared to utilizing a grounded collimator. However, a grounded collimator can be used with this invention instead of an electrically isolated collimator, as described in this further embodiment. When using an electrically isolated collimator, the inventive process of improving step coverage of contact holes saves money and time, and is, thus, more efficient than prior art techniques.

In a third embodiment of the invention, during PVD of a material, a substrate bias is applied during deposition such that a portion of the deposited material on the contact bottom is resputtered onto contact sidewalls. In the preferred case, titanium is the deposited material. A subsequent anneal step in a nitrogen-containing ambient forms a passivating titanium nitride film on the sidewalls of the contact. This passivating film protects the underlying substrate from degradation when metal interconnect material is subsequently deposited in the contact hole. By resputtering a portion of the deposited titanium onto the sidewalls of the contact hole, chemical vapor deposition of titanium nitride is not required to form a titanium nitride film on the contact sidewalls. In this embodiment of the invention, any type of deposition is used, such as ion beam, electron beam, and high density plasma sputter deposition among others well known to one skilled in the art. A collimator and the faceting technique of the first and second embodiments of the invention are not needed to accomplish the object of this third embodiment.

DETAILED DESCRIPTION

Titanium, or another refractory metal, is deposited within a recess in a semiconductor structure by sputtering. Controlling a substrate bias voltage at various levels during the sputtering causes a facet to form on the top of the recess, allowing better bottom step coverage with the refractory metal.

Figure 1:
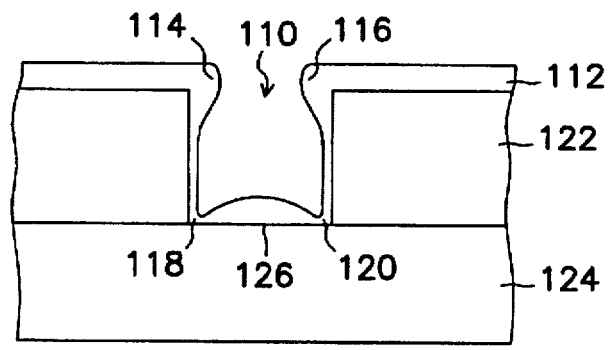
FIG. 1 is a cross-sectional representation of a prior art contact hole deposited with a metal.
Figure 2A:
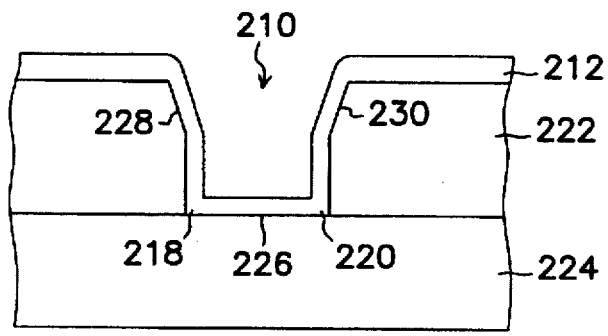
FIG. 2 is a cross-sectional representation illustrating a method for reducing material overhang at the top of a contact hole.
Figure 2B:
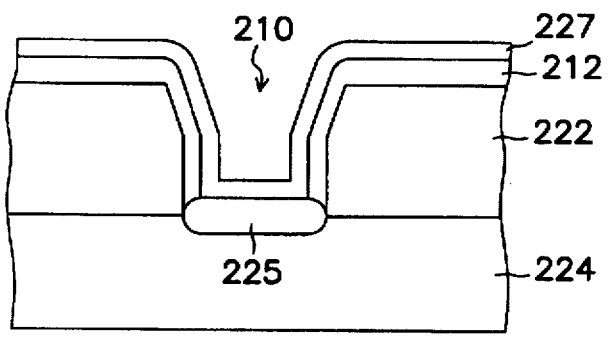

FIG. 2 is a cross-sectional representation of a semiconductor structure comprising a contact hole 210 etched into an second material layer 222 and overlying a semiconductor substrate 224. The second material 222 typically comprises an oxide, such as silicon dioxide, or another insulating material, such as borophosphosilicate glass (BPSG). Facets 228 and 230 are formed on the top corners of the contact hole 210 to reduce material overhang during subsequent sputtering steps. Sputtering is used to deposit a refractory metal 212, such as titanium, tungsten, tantalum, and molybdenum, and to form a silicided contact.

Figure 3:
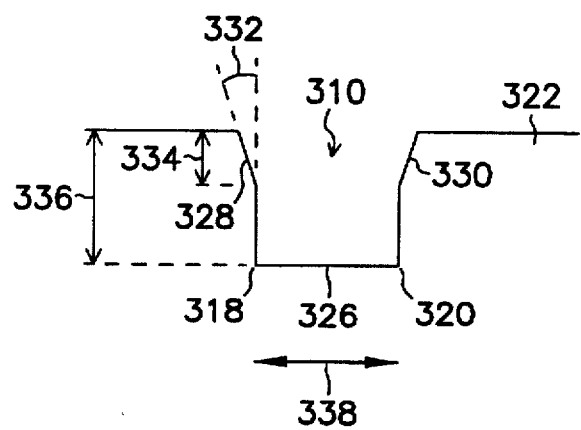
FIG. 3 is a cross-sectional representation illustrating details of a facet formed at the top of the contact hole of FIG. 2.

The angle 332 of the facet, as shown in FIG. 3, is dictated by the intrinsic properties of the sputtered material. If the corner 328 is faceted to its full extent, it will acquire some angle 332 with respect to the surface of the wafer 322. The facet angle 332 formed is always that angle at which the material being sputtered has the highest sputter yield. This angle 332 forms naturally, without any external forcing, during a resputtering step. Angulation of the facets 328 and 330 causes sputtered material to redeposit itself and prevents shadowing of the bottom corners 318 and 320 of the contact hole 310. Thus, sputtered material can reach the bottom corners 318 and 320 of the contact hole 310, improving step coverage.

In the preferred case of titanium deposition, it is highly desirable to create a sufficient titanium layer in the bottom corners 318 and 320 of a contact hole 310, as shown in FIG. 3, because that is typically where remaining native oxide remains. Due to the ability of titanium to reduce oxygen, it is necessary that titanium coverage in those areas be adequate, in order to reduce native oxides and minimize possibilities of contact failure.

As shown in FIG. 3, facet 328 is preferably formed to a depth 334 in a contact hole of depth 336. Generally, facet depth 334 is approximately 300 angstroms or less, so that circuit density is not severely affected. The facet 328 is formed at an angle 332 from the vertical. This angle 332, if allowed to facet to its full extent, depends on the material. However, adjustments to these depths 334 and 336 and this angle 332 are within the scope of this invention.

Figure 4:
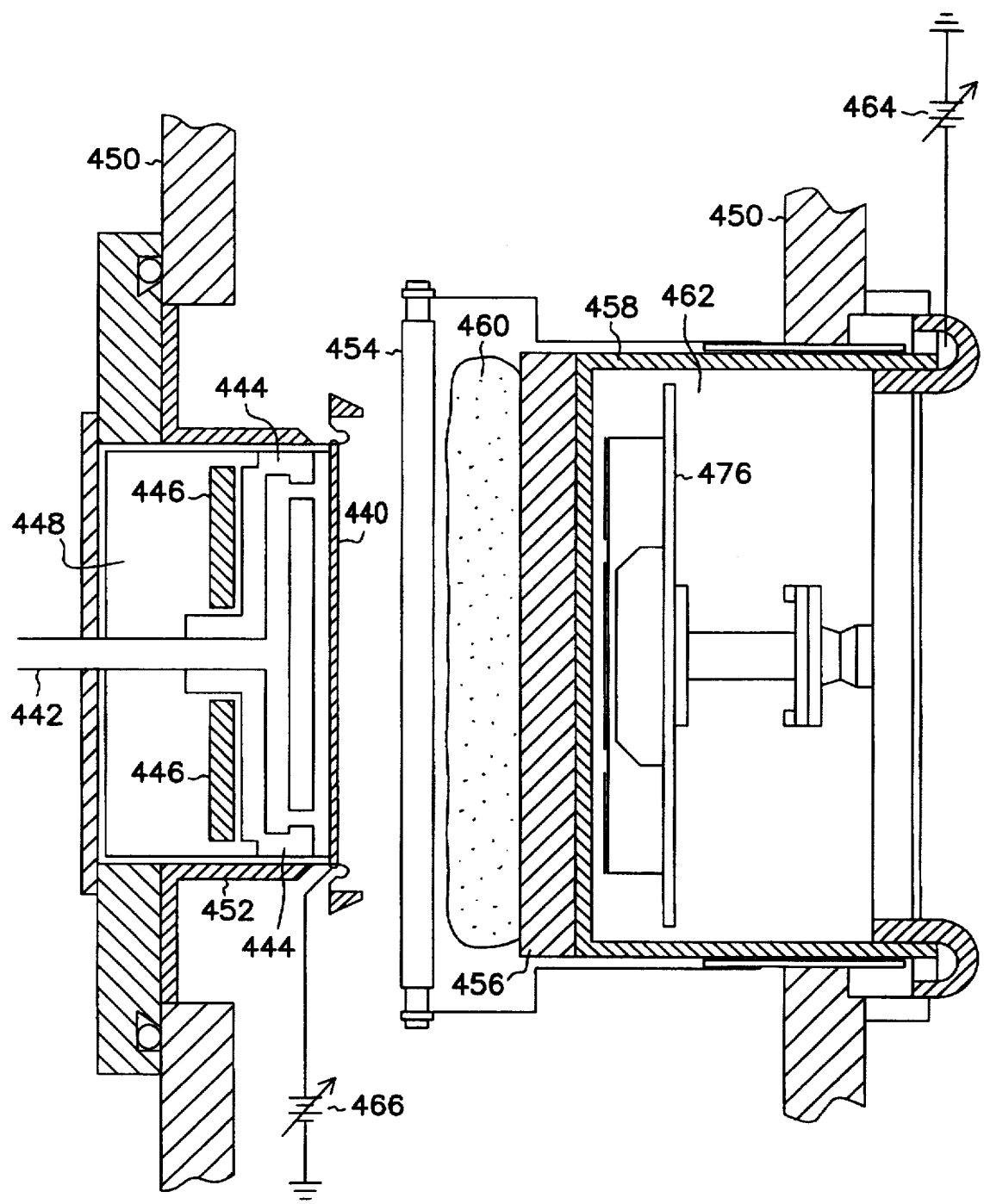
FIG. 4 is a block diagram of a sputtering apparatus suitable for use with this invention, having a direct current substrate bias voltage source.

A layer of deposited material is formed using the sputtering system shown in FIG. 4. A semiconductor structure, such as a wafer 440, is located within the sputtering system. The system components comprise a gas inlet 442 encased in a heater block 444, heater elements 446 and insulation 448 mounted to chamber walls 450, and chamber shields 452. Further components comprise a collimator 454, coupled between the semiconductor structure 440 and a target 456 and backing plate 458. A plasma 460 is created in the area between the collimator 454 and the target 456. Other components include a rotating magnet 476, encased in a water cooling system 462.

As shown in FIG. 4, target 456 is comprised of a selected material to be deposited. In this example, a standard target is used, preferably titanium, but any similar metal (including elemental metals, alloys, and other compounds) may be used, and variations can be performed in the following process steps, without departing from the scope of the invention. An ion source (plasma 460) is separated from the target 456 by a thin sheath. The distance between the target 456 and the substrate 440 is approximately 14 centimeters in this example. However, this distance is variable. Generally, the longer the distance, the greater the effective collimation of the system. Unfortunately, the trade off with using longer distances is a decrease in deposited film uniformity and deposition rate.

In one embodiment, a process window starts by introducing an inert gas, such as argon, into the space between the target 456 and collimator 454 to form the plasma 460, and allowing it to stabilize (approximately less than 10 seconds), as shown in FIG. 4. Although argon is preferred due to its low cost and good sputter yield, any noble gas can be used. Reactive gases can also be used, but they may become constituents of the deposited film. The plasma 460 is formed by placing the chamber gas under low, sub-atmospheric pressures. A plasma 460 is a mixture of positively-charged gas ions and free electrons. A pressure of approximately 1.3millitorr is currently used to create the plasma 460.

A large negative bias voltage is then applied to the target 456 from source 464, directing the plasma ions 460 to the target 456 and sputtering it for a period of time, allowing a steady-state to be reached, and applying a substrate bias from source 466 to resputter deposited material, forming a facet at the top corner of the contact hole. The time period for this step is approximately less than 60 seconds. However, this period of time depends on the system being used, and what type of material is being faceted. Furthermore, other process parameters, such as gas pressure, deposition rate of the sputtered target material, wafer size and substrate bias voltage affect this time period.

The voltage induced on the target 456 may be either direct current (DC) type or radio frequency (RF) type, from source 464, as shown in FIG. 4. Typically, RF voltage is better because it produces a higher ion current (which causes the resputtering) for a given power than DC voltage. The target voltage is determined as a function of chamber impedance. A target voltage of approximately 525 Volts is utilized in this example. Collimator 454 is conventionally mounted to chamber walls 450, which are at ground potential, using aluminum backing plates 458. A 1:1collimator 454, having an aspect ratio of 1, works well for this process.

Substantially simultaneously with application of the target 456 bias, a large negative bias voltage is applied to the substrate 440, as shown in FIG. 4. This initiates a first resputtering scheme, where material overhang is redistributed and some of the insulating layer 222 is removed to form facets 228 and 230, as shown in FIG. 2. The insulating layer 222 is typically an oxide, particularly silicon dioxide, or BPSG. However, other materials may comprise the insulating layer 222 without departing from the scope of the invention.

In this example, a negative bias voltage is applied to the substrate surface 440, as shown in FIG. 4, causing it to act like another target. The voltage induced on the substrate 440 may be either a DC-type voltage, or a RF-type voltage. For example, using a 1:1 collimator, as in this example, a RF power of approximately 500 to 700 Watts produces a RF voltage of between approximately 550 to 750 Volts in this first substrate bias step. However, the power applied is highly dependent on the configuration of the sputtering apparatus, among other parameters, and is adjusted accordingly.

Figure 5:
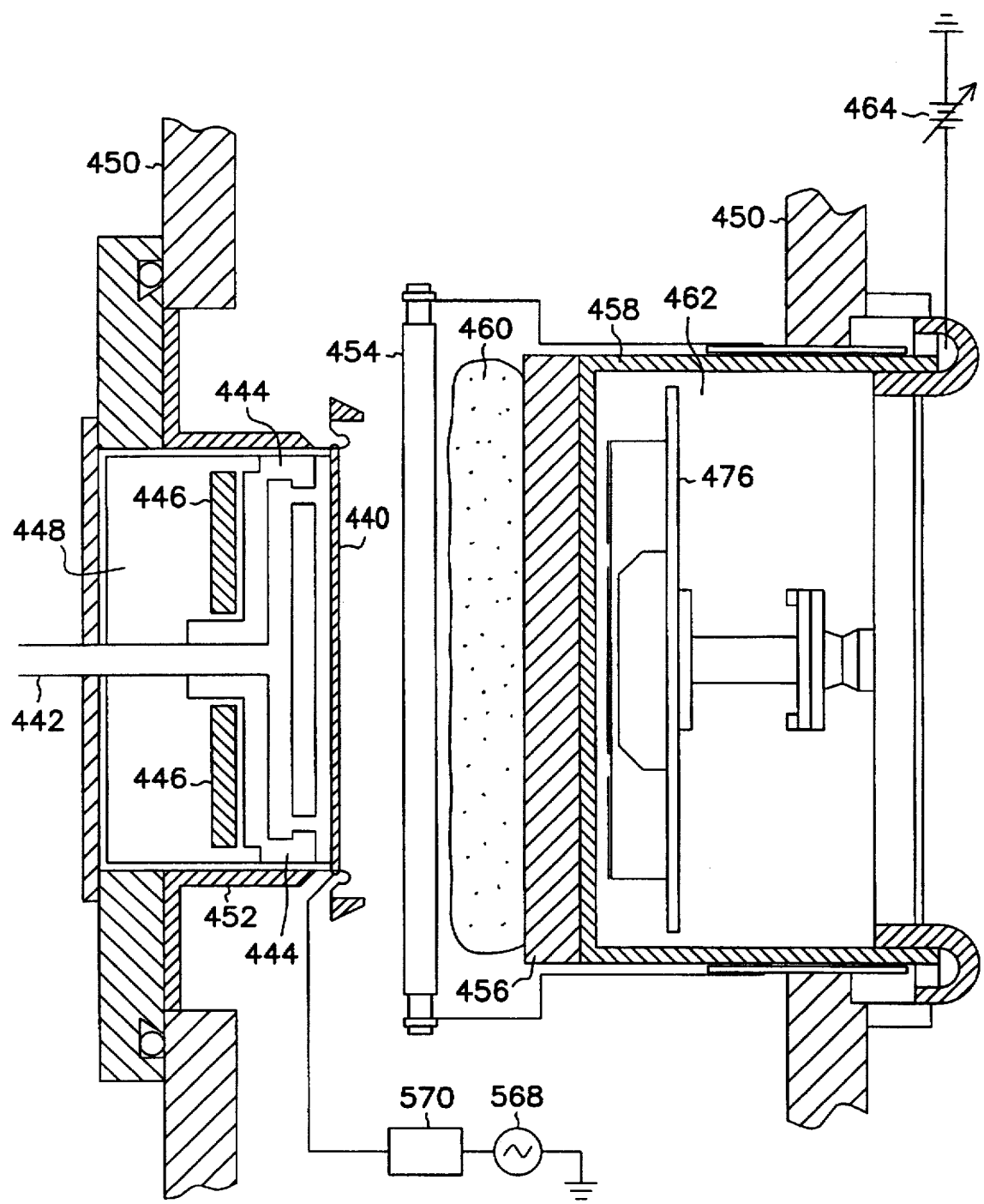
FIG. 5 is a block diagram of a sputtering apparatus suitable for use with this invention, having a radio frequency substrate bias voltage source.

FIG. 4 illustrates a DC-type variable voltage source 466. Typically, RF voltage is better because it produces a higher ion current (which causes the resputtering) for a given power than DC voltage. However, it is not necessary to practice this invention. FIG. 5 shows one embodiment of the substrate bias voltage source, comprising a RF-type voltage supply 568 and its associated matching box 570. For faceting the oxide material, an RF voltage source 568 is used to apply the highest substrate bias voltage and the lowest target power as is possible, without damaging the device. As a result, the resputtered insulator material does not remain on the bottom of the contact hole, due to the high substrate bias applied during this resputtering step.

As shown in FIG. 2, the substrate bias produces resputtering of sputterdeposited material 212 and some of the underlying insulating layer 222, such that facets 228 and 230 form on the top corners of the contact hole 210. The amount of time that it takes to form a facet 228, 230 depends on process parameters, such as chamber gas pressure, wafer size, deposition rate of the target material, substrate bias, and the type of collimator used. It is desirable, however, to form an adequate facet 228, 230 in the shortest possible time period, in a way that allows the most material to subsequently deposit at the bottom 226 of the contact hole 210 during the next step.

There is an appropriate time duration for the application of the substrate bias during the resputtering step, as shown in FIG. 2. That is, if a substrate bias strong enough to cause a facet 228, 230 is employed during the entire time of the deposition, little or no material will deposit at the bottom 226 of the contact hole 210. Furthermore, it is likely that damage will occur at the semiconductor junction. However, even if a substrate bias is too weak to form a facet 228, 230, it may be strong enough to remove some sputtered material 212 from the bottom 226 of the contact hole 210, which is undesirable if too much material 212 is removed, because it may also lead to damage at the semiconductor junction, and ultimately junction failure. Thus, it is important that a substrate bias is not applied long enough to cause damage at the semiconductor junction.

As stated above and shown in detail in FIG. 3, facet 328 is formed to a depth 334 in a contact hole of total depth 336. Facet depth 334 is approximately 300 angstroms or less, so that circuit density is not severely affected. However, this facet depth 334 is highly dependent on the dimensions of the integrated circuit. The facet 328 is formed at an angle 332 from the vertical. When BPSG is faceted, an angle 332 of approximately 45 degrees with respect to the perpendicular wafer surface is formed. However, different materials inherently form different facet angles 332.

The next step in the process window is to reduce the substrate bias sufficiently to terminate formation of the facet 328, as shown in FIG. 3. For example, reducing the RF power to approximately 100 to 200 Watts produces a RF substrate bias voltage of approximately 150 to 250 Volts. In this example, this step occurs after initiation of the first resputtering scheme. However, depending on the desired deposition area, the net deposition rate at the contact hole bottom 326, the aspect ratio of the contact hole 310 (ratio of height 336 to width 338), the aspect ratio of the collimator, the chamber gas pressure, and the facet angle 332, this timing and voltage can be different than that described in this example. Thus, process window times and bias voltages are adjusted accordingly.

Depending on the target voltage used, the deposition rate may not be high enough to deposit material on the bottom 326 of the contact hole 310, as shown in FIG. 3, within a desired time period. The target voltage is determined as a function of chamber impedance. In this example, a target voltage of approximately 550 Volts is used. The substrate bias voltage, the chamber gas pressure, or the spacing between the target and substrate can be adjusted to obtain the desired deposition rate. For example, a high-aspect ratio collimator does not require a substrate bias as high as that required by a collimator with a lower aspect ratio because less material overhang will develop due to the more controlled angle of incidence of sputtered atoms passing through the high-aspect ratio collimator. Furthermore, there is a trade off between higher deposition rates and more material overhang when adjusting the chamber gas pressure. High chamber gas pressures cause more material-argon scattering, and increase material overhang.

The type of contact hole 310 also dictates the need for adjustments in process parameters, as shown in FIG. 3. For example, where material overhang is more tolerable, depending on the device and type of material deposited, a substrate bias need not be applied for the duration of this entire step. However, a contact hole 310 with a very high aspect ratio, needing complete vertical film growth from the bottom 326 of the contact hole 310, may need to have a bias applied during this entire step. While application of a substrate bias slows the net accumulation of material at the contact hole 310 bottom 326 during this step, it is needed to prevent material overhang from obstructing the paths of sputtered atoms. The majority of devices require a substrate bias during this step, to keep material overhang from forming and allow material to deposit at the bottom 326 of the contact hole 310. The time duration of this step is dictated by the type of device and desired thickness of material deposited at the bottom 326 of the contact hole 310.

Due to removal of the material overhang during faceting, material is able to be deposited on the bottom corners 318 and 320 of contact holes 310, as shown in FIG. 3, areas which have frequently been hard to reach in the past due to material overhang. It is these areas that are particularly prone to containing remaining native oxides. Thus, depositing material, such as titanium, in these corners 318 and 320 effectively reduces native oxides upon subsequently annealing the structure. When a lower substrate bias is applied during this step, material is resputtered from the facet 328. Depending on the angle 332 of the facet 328, the aspect-ratio of the contact hole 310, and the substrate bias, among other process parameters, material is resputtered into the bottom 326 of the contact hole 310, as well as being directly sputter-deposited from the target. Furthermore, sputter depositing in a low bias regime during the second step reduces removal of material from the bottom 326 of the contact hole 310, which can result in degradation of the device. The purpose of this step is to deposit the desired material on the bottom 326 of the contact hole 310 in the shortest amount of time, while keeping material overhang at a tolerable level. When material overhang is reduced, insufficient fill and keyhole or pinhole structures are much less likely to occur. Subsequently deposited layers in contact hole 310 also obtain better step coverage when the material overhang has been reduced. When depositing titanium in a contact hole 310 to silicide a contact, subsequent process steps comprise annealing, to form titanium silicide, and depositing a conductor such as aluminum, or tungsten, in the contact hole 310. Resulting contact resistance is lower, and the semiconductor/metal interface has a lower defect density.

Once the deposited material is formed in the desired configuration, the sputtering apparatus is turned off. Depending on the desired thickness, the size of the hole, and the materials involved, this time period is adjusted accordingly. The resulting film has improved step coverage over films deposited using prior art techniques.

In another embodiment of the invention, the first resputtering scheme is initiated a period of time after the target is biased, allowing a deposited film to form on the substrate. In this embodiment, the growing deposited film is faceted instead of the insulating layer. Faceting the deposited film has certain advantages over faceting the insulating layer. When titanium is faceted, an angle 332 of approximately 35 degrees with respect to the perpendicular from the wafer surface 322 is formed, as shown in FIG. 3. When subsequent material is deposited on the faceted surface 328, the surface already has the angle 332 of maximum sputter yield for that material. Therefore, more material will resputter from the facet 328 onto the bottom 326 of the contact hole 310, depending on the aspect ratio of the hole 310. Note that for high aspect ratio holes, material will not generally resputter to the bottom of the contact hole 310. Furthermore, faceting the growing film does not require a substrate bias voltage as high as that required for faceting an insulating material. This allows more material to be sputter-deposited directly onto the bottom 326 of the contact hole 310, depending on its aspect ratio.

Due to the different facet angle 332 formed, as shown in FIG. 3, than that formed when faceting the insulating layer 322, and the lower substrate bias required, material can accumulate in the contact 310 and on the bottom comers 318 and 320 as a second layer of material, depending on the aspect ratio of the contact hole 310. This is desirable, because the bottom comers 318 and 320 of contact holes 310 often contain remaining native oxides, which subsequently-deposited titanium reduces upon annealing, improving the ohmic contact. Furthermore, the bottom comers 318 and 320 of contact holes 310 are the areas which are frequently not covered adequately during deposition, due to material overhang.

However, one disadvantage of this process is that the first layer of material (the faceted film of target material) is usually at a different stress than the second layer of material (the film of target material deposited after the facet step). Depending on the materials and other properties, film peeling may result.

In a further embodiment of the invention, a substrate bias is applied during the second bias step, such that a portion of the deposited material on the contact bottom is resputtered onto contact sidewalls. For example, a substrate bias voltage of greater than approximately 100 Volts is sufficient to accomplish this result for most materials. To resputter material to the sidewalls of a contact, a substrate bias voltage of greater than that of the sputtering threshold of the resputtered material is necessary. However, the substrate bias voltage is adjusted according to the configuration of the sputtering apparatus, among other parameters.

In the preferred case, titanium is the deposited material. A subsequent anneal step in a nitrogen-containing ambient forms a passivating titanium nitride film on the sidewalls of the contact. This anneal step is preferably the same anneal step that is used to form titanium silicide from the deposited titanium on the bottom of the contact hole. This passivating film protects the underlying substrate from degradation when metal interconnect material is subsequently deposited in the contact hole. It is preferred that the deposition and annealing be performed in the same chamber, which is preferably a high-vacuum chamber, to prevent oxidation of deposited titanium. By resputtering a portion of the deposited titanium onto the sidewalls of the contact hole, chemical vapor deposition of titanium nitride is not required to form a titanium nitride film on the contact sidewalls.

Figure 6:
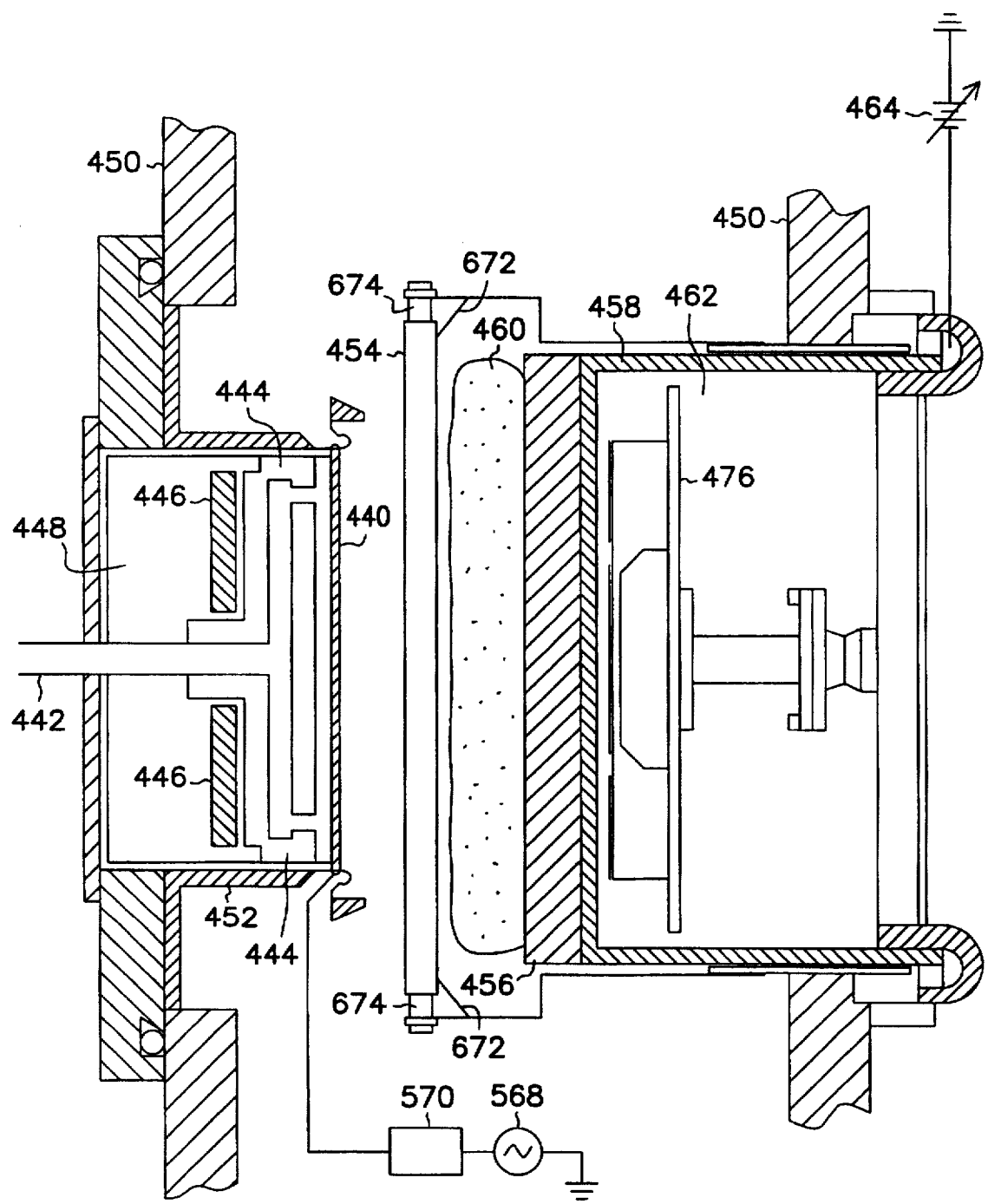
FIG. 6 is a block diagram of a sputtering apparatus suitable for use with this invention, having a direct current substrate bias voltage source and an electrically isolated collimator.

In yet a further embodiment of the invention, the sputtering apparatus utilizes an electrically isolated collimator 654, as shown in FIG. 6. The substrate bias is achieved using the same methods as described above. Voltage source 658 supplies the desired substrate bias. Collimator 654 is mounted to chamber walls 650, which are at ground potential. The use of an electrically isolated collimator 654 allows for a higher degree of ion current to be directed to the wafer 640 for a given input power, or voltage. Therefore, in the process steps which utilize a substrate bias, approximately a 35% decrease in bias voltage is obtained using this configuration, compared to a comparable prior art sputtering apparatus. Furthermore, existing equipment is easily adapted to this preferred configuration by installing a switch 672 between the collimator 654 and ground. Thus, by switching the switch 672 ON/OFF between insulative material 674 on the ends of the collimator, existing equipment can be operated in either a grounded collimator state, or in a preferred electrically-isolated collimator state.

Figure 7A:
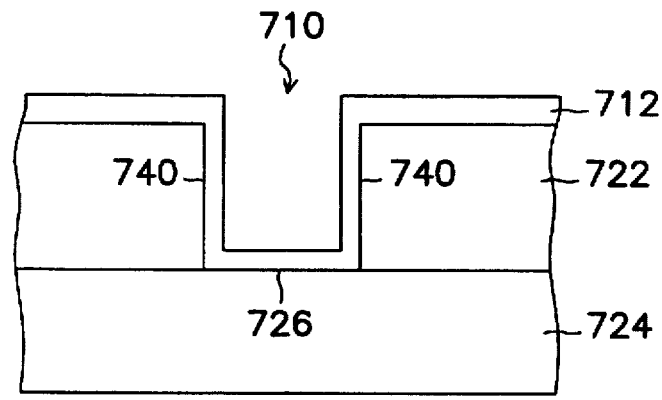
FIGS. 7A and 7B show a cross-sectional representation of a contact hole in accordance with a third-embodiment of the invention.
Figure 7B:
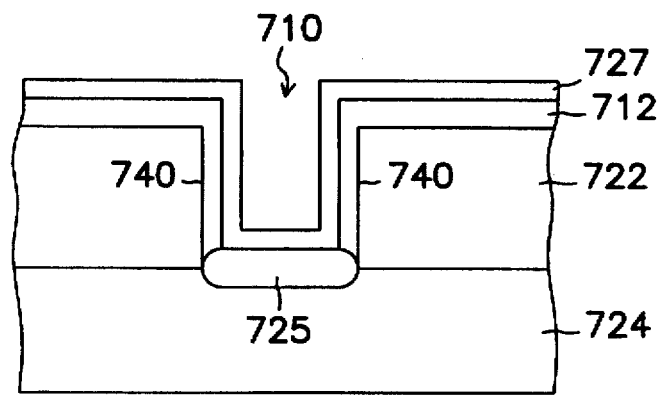

In a third embodiment of the invention, as shown in FIGS. 7a and 7b, during PVD of a material, a substrate bias is applied during deposition such that a portion of the deposited material 712 on the contact bottom 726 is resputtered onto contact sidewalls 740. Sputtering is used to deposit a refractory metal 712, such as titanium, tungsten, tantalum, and molybdenum, and to form a silicided contact. In the preferred case, titanium is the deposited material 712. The contact hole 710 is etched into an second material layer 722, overlying a semiconductor substrate 724. The second material 722 typically comprises an oxide, such as silicon dioxide, or another insulating material, such as borophosphosilicate glass (BPSG). A subsequent anneal step in a nitrogen-containing ambient forms a passivating titanium nitride film 727 on the sidewalls 740 of the contact hole 710. This passivating film 727 protects the underlying materials 722 and 724 from degradation when metal interconnect material is subsequently deposited in the contact hole 710. By resputtering a portion of the deposited titanium 712 onto the sidewalls 740 of the contact hole 710, chemical vapor deposition of titanium nitride 727 is not required to form a titanium nitride film 727 on the contact sidewalls 740.

In this embodiment of the invention, any type of PVD is used, such as ion beam, electron beam, and high density plasma sputter deposition among others well known to one skilled in the art. A collimator and the faceting technique of the first and second embodiments of the invention are not needed to accomplish the object of this third embodiment.

A process window starts by introducing an inert gas, such as argon, into the space between the target 456 and collimator 454 to form the plasma 460, and allowing it to stabilize (approximately less than 10 seconds), as shown in FIG. 4. Although argon is preferred due to its low cost and good sputter yield, any noble gas can be used. Reactive gases can also be used, but they may become constituents of the deposited film. The plasma 460 is formed by placing the chamber gas under low, sub-atmospheric pressures. A pressure of approximately 1.3 millitorr is currently used to create the plasma 460.

A large negative bias voltage is then applied to the target 456 from source 464, directing the plasma ions 460 to the target 456 and sputtering it for a period of time, allowing a steady-state to be reached, and applying a substrate bias from source 466 to resputter deposited material 712 to the sidewalls 740 of a contact hole 710, as shown in FIG. 7a. The voltage induced on the target 456 may be either direct current (DC) type or radio frequency (RF) type, from source 464, as shown in FIG. 4. Typically, RF voltage is better because it produces a higher ion current (which causes the resputtering) for a given power than DC voltage. The target voltage is determined as a function of chamber impedance. A target voltage of approximately 525 Volts is utilized in this example.

Substantially simultaneously with application of the target 456 bias, a large negative bias voltage is applied at the substrate 440, as shown in FIG. 4. This initiates a resputtering scheme. In this example, a negative bias voltage is applied at the substrate surface 440, as shown in FIG. 4, causing it to act like another target. The voltage induced on the substrate 440 may be either a DC-type voltage, or a RF-type voltage. FIG. 4 illustrates a DC-type variable voltage source 466. The substrate bias voltage is adjusted according to the material being resputtered. For example, a RF substrate bias voltage of greater than approximately 100 Volts is usually sufficient to resputter a portion of the deposited material to sidewalls of a contact hole and elsewhere. To resputter material 712 to the sidewalls 740 of a contact hole 710, as shown in FIG. 7a, a substrate bias voltage of greater than that of the sputtering threshold of the resputtered material 712 is necessary. However, the substrate bias voltage is also adjusted according to the configuration of the sputtering apparatus, among other parameters.

Typically, RF voltage is better because it produces a higher ion current (which causes the resputtering) for a given power than DC voltage. However, it is not necessary to practice this invention. FIG. 5 shows one embodiment of the substrate bias voltage source, comprising a RF-type voltage supply 568 and its associated matching box 570.

Once the deposited material 712 is resputtered in the desired configuration, as shown in FIG. 7a, the sputtering apparatus is turned off. Depending on the desired material 712 thickness, the size of the contact hole 710, and the types of materials 712, 722, and 724 involved, this time period is adjusted accordingly. The resulting contact hole 710 has a continuous layer of titanium 712 deposited on its sidewalls 740. A subsequent anneal step in a nitrogen-containing ambient forms a passivating titanium nitride film 727 on the sidewalls 740 of the contact hole 710, as shown in FIG. 7b, simultaneously with formation of titanium silicide 725 at the bottom 726 of the contact hole 710. This passivating film 727 protects the underlying materials 722 and 724 from degradation when metal interconnect material is subsequently deposited in the contact hole 710. It is preferred that the deposition steps and the annealing steps be performed in the same high vacuum chamber to prevent oxidation of the titanium surface 712 between the two steps.

As shown in FIGS. 7a and 7b, this embodiment of the invention solves problems resulting from achieving better bottom step coverage of high aspect ratio contact holes 710. High aspect ratio collimators and contacts essentially eliminate titanium deposition 712 on the sidewalls 740 at the bottom of a contact hole 710. This leaves exposed silicon 724 after titanium 712 deposition steps. If a barrier material, such as titanium nitride 727, is not present, subsequent metal deposition will aggressively attack the bare silicon 724 and jeopardize contact integrity. Furthermore, by resputtering a portion of the deposited titanium 712 onto the sidewalls 740 of the contact hole 710, chemical vapor deposition (CVD) of titanium nitride is not required to form a titanium nitride film 727 on the contact sidewalls 740. It is preferable not to use CVD to deposit titanium nitride films 727 on sidewalls 740 of contacts 710 because CVD-deposited films often contain unwanted impurities, introduced during the CVD process.

The methods and apparatus of this invention are applicable to sputter-depositing any material into any type of recess. Materials, dimensions, and other process parameters are adjusted accordingly to achieve better step coverage of such recesses. Furthermore, the above description is not meant to limit the scope of the invention to depositions of elemental metals, such as titanium, and thus includes a wide variety of other materials, such as alloys and composites. However, when using compound materials, different sputter yields for each constituent element cause compositional changes in material resputtered from the faceted corners.

What is claimed is:

1. A contact hole, defined by a bottom and sidewalls, comprising titanium silicide on the bottom and a substantially continuous layer of titanium nitride on the sidewalls, wherein the titanium nitride is formed by:

physical vapor deposition of titanium into the contact hole;

resputtering the titanium onto the sidewalls; and annealing the contact hole in a nitrogen-containing ambient.

2. A method of depositing a first material onto a semiconductor substrate which comprises a recess, having a bottom, and defined by sidewalls comprising a second material, the method comprising the steps of:

sputtering the first material onto the semiconductor substrate, to form a layer of sputterdeposited material;

applying a first bias voltage to the substrate sufficient to create a facet on the sputter-deposited material, but not sufficient enough to create a facet on the second material, while simultaneously resputtering the sputter-deposited material; and applying a second bias voltage to the substrate following formation of the facet while simultaneously sputter-depositing the first material onto the bottom of the recess.

3. The method of claim 2, in which the first material comprises a refractory metal, selected from the group consisting of titanium, tungsten, tantalum, and molybdenum and the second material comprises an insulating material, selected from the group consisting of oxides and borophosilicate glass.

4. The method of claim 2, in which the recess comprises a contact hole opening.

5. The method of claim 2, in which the sputtering step comprises utilizing a collimator for sputtering.

6. The method of claim 5, in which the collimator utilized is electrically isolated from the sputtering system.

7. The method of claim 2, in which the first bias voltage is approximately 550 to 750 Volts.

8. The method of claim 2, in which the second bias voltage is sufficient to prevent overhang of the first material from forming on the top of the recess, but not large enough to further facet the sputter-deposited material.

9. The method of claim 2, in which the second bias voltage is approximately 150 to 250 Volts.

10. The method of claim 2, in which the second bias voltage is sufficient to resputter a portion of the first material deposited on the recess bottom onto the sidewalls.

11. The method of claim 2, in which the second bias voltage is approximately at least the sputtering threshold voltage of the first material.

12. The method of claim 2, in which the facet formed at the top of the recess has an angle corresponding to the angle at which the first material has the highest sputter yield.

13. The method of claim 2, in which the time period for the first bias voltage is less than approximately 60 *seconds*.

14. A method of depositing titanium into a recess, defined by a recess bottom and further defined by sidewalls comprising a second material, the method comprising the steps of:

sputtering the titanium onto the recess bottom while applying a bias voltage to an underlying substrate, to simultaneously resputter the titanium from the bottom of the recess onto the sidewalls; and annealing to form titanium nitride on the sidewalls and titanium silicide on the recess bottom wherein the sputtering step and the annealing step are performed in the same high vacuum chamber.

15. The method of claim 14, in which the recess comprises a contact hole opening.

16. The method of claim 14, in which the bias voltage is at least as great as the sputtering threshold of the first material.

* * * * *